(12) United States Patent
Perner (10) Patent No.: US 7,224,598 B2
(45) Date of Patent: May 29, 2007

(54) PROGRAMMING OF PROGRAMMABLE RESISTIVE MEMORY DEVICES (75) Inventor: Frederick A. Perner, Santa Barbara, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 237 days.

(21) Appl. No.: 10/933,039

(22) Filed: Sep. 2, 2004

(65) Prior Publication Data
US 2006/0044878 A1 Mar. 2, 2006

(51) Int. Cl.
*G11C 11/00* (2006.01)

(52) U.S. Cl. ............... 365/148; 365/189.07; 365/201

(58) Field of Classification Search ........... 365/148, 365/189.07, 201
See application file for complete search history.

(56) References Cited

U.S. PATENT DOCUMENTS

| | | | |
|---|---|---|---|
| 6,084,796 A | 7/2000 | Kozicki | |
| 6,348,565 B1 | 2/2002 | Wehmeyer | |
| 6,418,049 B1 | 7/2002 | Kozicki | |
| 6,487,106 B1 | 11/2002 | Kozicki | |
| 6,597,598 B1 * | 7/2003 | Tran et al. | 365/94 |
| 6,635,914 B2 | 10/2003 | Kozicki | |
| 6,638,820 B2 | 10/2003 | Moore | |
| 6,653,193 B2 | 11/2003 | Gilton | |
| 6,709,887 B2 | 3/2004 | Moore | |
| 6,709,958 B2 | 3/2004 | Li | |
| 6,710,423 B2 | 3/2004 | Moore | |
| 6,727,192 B2 | 4/2004 | Moore | |
| 6,730,547 B2 | 5/2004 | Li et al. | |
| 6,731,528 B2 | 5/2004 | Hush | |
| 6,847,544 B1 * | 1/2005 | Smith et al. | 365/158 |
| 6,873,543 B2 * | 3/2005 | Smith et al. | 365/158 |
| 2002/0190289 A1 | 12/2002 | Harshfield | |
| 2003/0027416 A1 | 2/2003 | Moore | |
| 2003/0045049 A1 | 3/2003 | Campbell | |
| 2003/0049912 A1 | 3/2003 | Campbell | |
| 2004/0043585 A1 | 3/2004 | Moore | |
| 2005/0073881 A1 * | 4/2005 | Tran et al. | 365/158 |

* cited by examiner

*Primary Examiner*—Hoai V. Ho

(57) ABSTRACT

Programming of a programmable resistive memory device includes supplying programming power to the device; generating feedback as to when the device has been programmed; and removing the programming power when the feedback indicates that the device has been programmed.

8 Claims, 6 Drawing Sheets

PROGRAMMING OF PROGRAMMABLE RESISTIVE MEMORY DEVICES

BACKGROUND

Programmable resistive memory devices are being considered for data storage. One type of programmable resistive memory device is a programmable metallization cell (PMC). A first logic value may be written to a programmable metallization cell memory device by setting the device to a low resistance state, and a second logic value may be written by setting the device to a high resistance state. The logic value stored in the device may be read by sensing device resistance.

Consider a programmable metallization cell including first and second conductors separated by a silver-rich dielectric. Unprogrammed, the programmable metallization cell has a high resistance between its conductors. However, when an appropriate voltage is applied across the conductors, a conductive filament begins to form between the conductors. Once the filament bridges the conductors, the resistance of the programmable metallization cell is reduced substantially. The programmable metallization cell may be restored to its original (higher) resistance state by reversing the voltage over time.

Random access memory (RAM) that is based on PMCs would have lower power consumption than short-term memory such as DRAM, SRAM and Flash memory, and it would perform read and write operations much faster (by orders of magnitude) than conventional long-term storage devices such as hard drives. PMC-based RAM would be more compact and consume less power than typical hard drives.

During the lifetime of PMC-based RAM, many write operations would be performed on each PMC memory device. Consequently, each PMC memory device would cycle between resistance states many times.

However, repeated cycles can be a problem for PMC-based RAM. PMC memory devices have limited "endurance." After a number of cycles, a PMC memory device cannot be restored to its original resistance state. Once this happens, the PMC memory device becomes unusable.

Error code correction could be used to recover data from an unusable memory device. However, if a large number of memory devices fail, the error code correction becomes costly, both from a time standpoint and a computational standpoint. If a large number of PMC memory devices fail, the PMC-based RAM can become unusable.

It would be desirable to increase the endurance of PMC memory devices.

SUMMARY

According to one aspect of the present invention, a method of programming a programmable resistive memory device includes supplying programming power to the device; generating feedback as to when the device has been programmed; and removing the programming power when the feedback indicates that the device has been programmed.

According to another aspect of the present invention, a data storage device includes a group of programmable resistive memory devices; and a circuit for supplying programming power to selected memory devices of the group. The circuit provides overwrite protection during programming of a selected memory device by turning off the programming power when a measured parameter of the selected memory device indicates that the selected memory device has been programmed.

Other aspects and advantages of the present invention will become apparent from the following detailed description, taken in conjunction with the accompanying drawings, illustrating by way of example the principles of the present invention.

DETAILED DESCRIPTION

As shown in the drawings for purposes of illustration, the present invention is embodied in the programming of individual programmable resistive memory devices, and resistive cross point arrays of programmable resistive memory devices. Reliability and endurance of individual memory devices are increased by generating feedback during programming, and stopping the programming when the feedback indicates that the devices have been programmed. As a result, the memory devices are not stressed by overwriting. In addition, the programming speed is improved because time is not wasted in overwriting the programmable resistive memory devices.

As for resistive cross point arrays, an equipotential sensing technique can be applied to selected and unselected memory devices. This equipotential technique can prevent sneak path currents from interfering with the programming of the selected memory devices. The interference can be prevented without blocking devices such as transistors or diodes (blocking devices would substantially reduce density of the memory devices and thereby increase the size and fabrication cost of the arrays).

Figure 1:
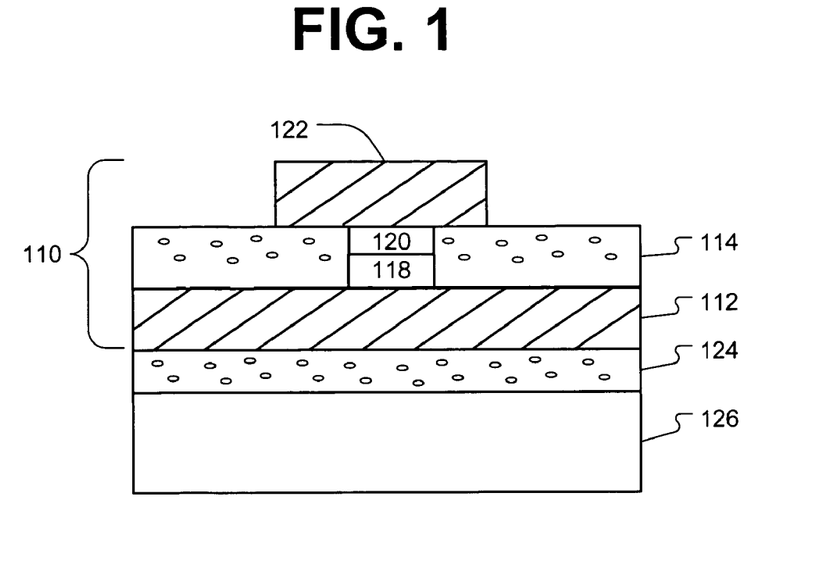
FIG. 1 is an illustration of a programmable metallization cell memory device.

Reference is made to FIG. 1, which illustrates an exemplary PMC memory device 110. The PMC memory device 110 includes a first metal conductor 112, and a dielectric 114 on the first metal conductor 112. The dielectric 114 may be made of an electrical insulator such as $Si_3N_4$, and the first metal conductor 112 may be made of a conductive metal such as copper, silver or zinc.

A via is etched in the dielectric 114. The PMC memory device 110 further includes solid electrolyte 118 contained within the via, a silver-rich layer 120 on the electrolyte 118 and within the via, and a second metal conductor 122 on both the silver-rich layer 120 and the dielectric 114. The second metal conductor 122 may be made of a conductive metal such as copper, silver or zinc.

The electrolyte is electrically connected to both metal conductors 112 and 122. The first metal conductor 112 forms a cathode, and the second conductor 122 forms an anode.

The electrolyte 118 may include silver (Ag) with germanium selenide (GeSe) or germanium sulfide (Ge—S). For example, silver can be dissolved in chacogenide glass to form a solid room temperature electrolyte. The silver and GeS or GeSe are nanoscopically phase separated. The silver alters the glass structure to allow ion transport. Silver ions in the electrolyte 118 are relatively mobile when an electric field is applied across the electrolyte 118.

A conductive filament between the first and second conductors 112 and 122 begins to form when a positive voltage is applied across the metal conductors 112 and 122, and the conductive filament begins to be removed when a negative voltage is applied. The process of building and removing the conductive filament is based on the effect of electric fields on mobile metal ions. Silver is known to perform as a mobile ion in some dielectrics. Hence when a positive voltage is applied, silver ions at the surface of the first conductor 122 are attracted to the second conductor 122 and form a filament that extends from the first conductor 112 to the second conductor 122. The process of building the filament continues as long as the positive voltage is applied. At some point in time during the building of the silver filament, the electrical resistance between the first and second conductors 112 and 122 will change from a very high resistance to a very low resistance (with a silver filament connecting the first and second conductors 112 and 122). The silver rich layer 120 provides a source of silver ions to build the conductive filament.

To remove the filament, a negative voltage is applied to the conductors 112 and 122, whereby silver ions drift to the first conductor 112 under the influence of a negative field. Over time, the PMC memory device 110 changes from a conducting state to a non-conducting state.

The PMC memory device 110 may be formed on an insulator 124. Read and programming circuits (not shown) may be formed in a semiconductor substrate 126 underlying the insulator 124. Vias (not shown) in the insulator 124 may allow electrical connections between the circuits and the memory device 110.

Figure 2:
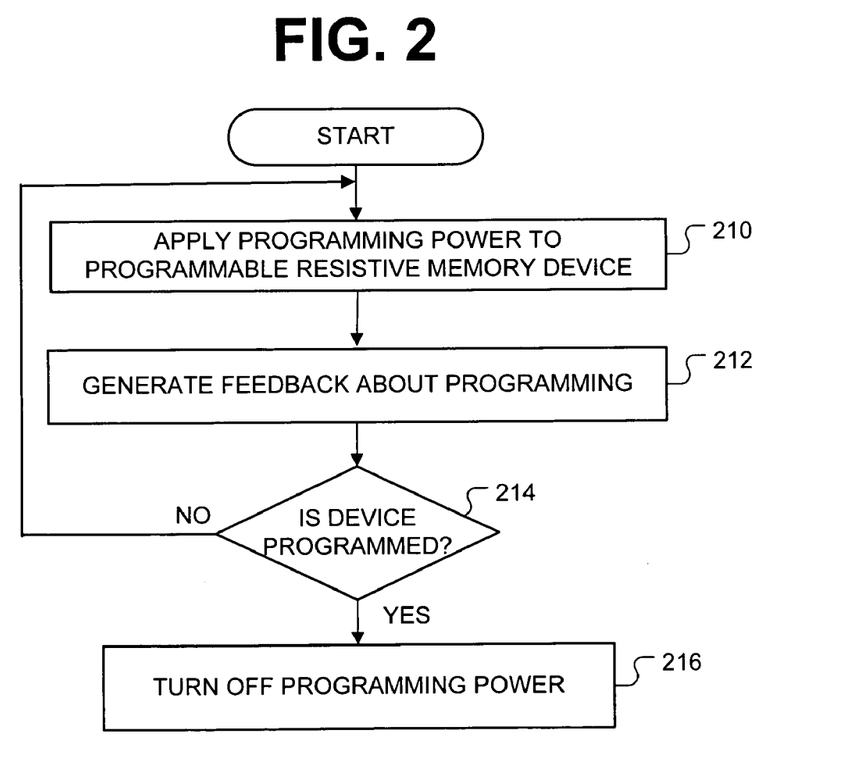
FIG. 2 is an illustration of a method of storing data in the programmable metallization cell memory device according to an embodiment of the present invention.

Additional reference is made to FIG. 2, which illustrates a method of programming the PMC memory device 110. Programming power is supplied to the memory device 110 (block 210). The programming power causes a current to flow through the memory device 110.

Feedback about the programming of the memory device 110 is generated (block 212). A parameter (e.g., resistance, voltage, current) of the memory device 110 may be sensed. For example, resistance of the memory device 110 is continually sensed. One method of sensing resistance is to apply a constant voltage across the memory device 110 (which has an unknown resistance) and a set of reference resistors (which have known resistances), and compare the resultant current through the memory device 110 to currents through the reference resistors.

When the feedback indicates the device 110 has been programmed (block 214), the programming power is turned off (block 216). For example, the sensed resistance of the memory device 110 reaches a resistance threshold. The threshold is set at a level that indicates an abrupt change in resistance. This abrupt change occurs when the memory device 110 has been programmed.

Figure 3A:
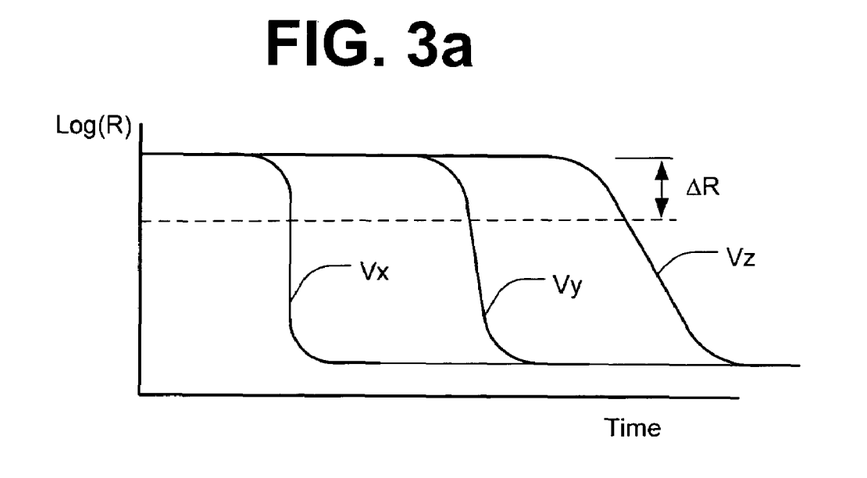
FIGS. 3a and 3b are illustrations of memory cell voltage and resistance over time during programming.

As illustrated in FIG. 3a, the change in resistance of a PMC memory device is a function of voltage and time. A higher voltage (Vx) causes an abrupt change in resistance to occur sooner than a lower voltage (Vz and Vy). The resistance of the PMC memory device 110 is a function of the current through it. However, the current through the PMC memory device 110 is the result of the applied voltage and the resistance of the PMC memory device 110. When the PMC memory device 110 begins to build a conductive filament, the internal fields change and the process of building the conductive filament becomes a non-linear function of the internal PMC currents and electric fields.

The programming power may be a constant DC voltage. In the alternative, the programming power may be applied as a series of voltage pulses, or a time-varying voltage. One example of a time-varying voltage is a programming potential ramp. The programming potential ramp is ramped up from a small voltage (e.g., 200-500 millivolts) to a higher voltage (e.g., 1-2 volts). Instead of a linear voltage function (i.e., the programming potential ramp), the voltage may be based on sine wave functions or other non-linear voltage functions.

Figure 3B:
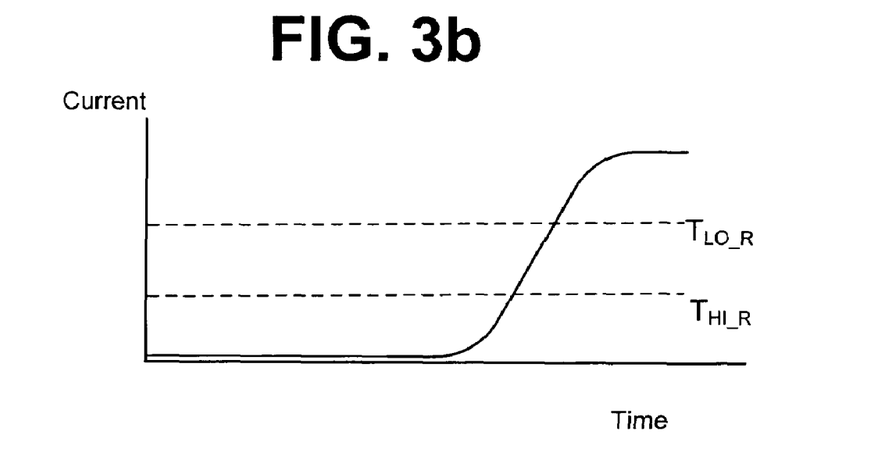

As the programming power is applied, a conductive pathway starts to form from the cathode of the memory device 110. Once the conductive pathway reaches the anode of the memory device 110, the resistance of the memory device 110 drops abruptly. As shown in FIG. 3b, the current through the memory device 110 is low while the resistance of the memory device 110 is high. Once the resistance drops abruptly, the current through the memory device 110 rises abruptly. The threshold $T_{LO\_R}$ is set at a level that corresponds to the abrupt change. The programming power is turned off when the resistance of the memory device 110 reaches the threshold $T_{LO\_R}$.

The memory device 110 can be changed from a low resistance state to a high resistance state by applying a negative programming voltage. The negative programming voltage is turned off when the resistance of the memory device 110 reaches the threshold $T_{HI\_R}$.

A data storage device can include a plurality of PMC memory devices 110. The data storage device may be a configured as a random access memory device.

Figure 4:
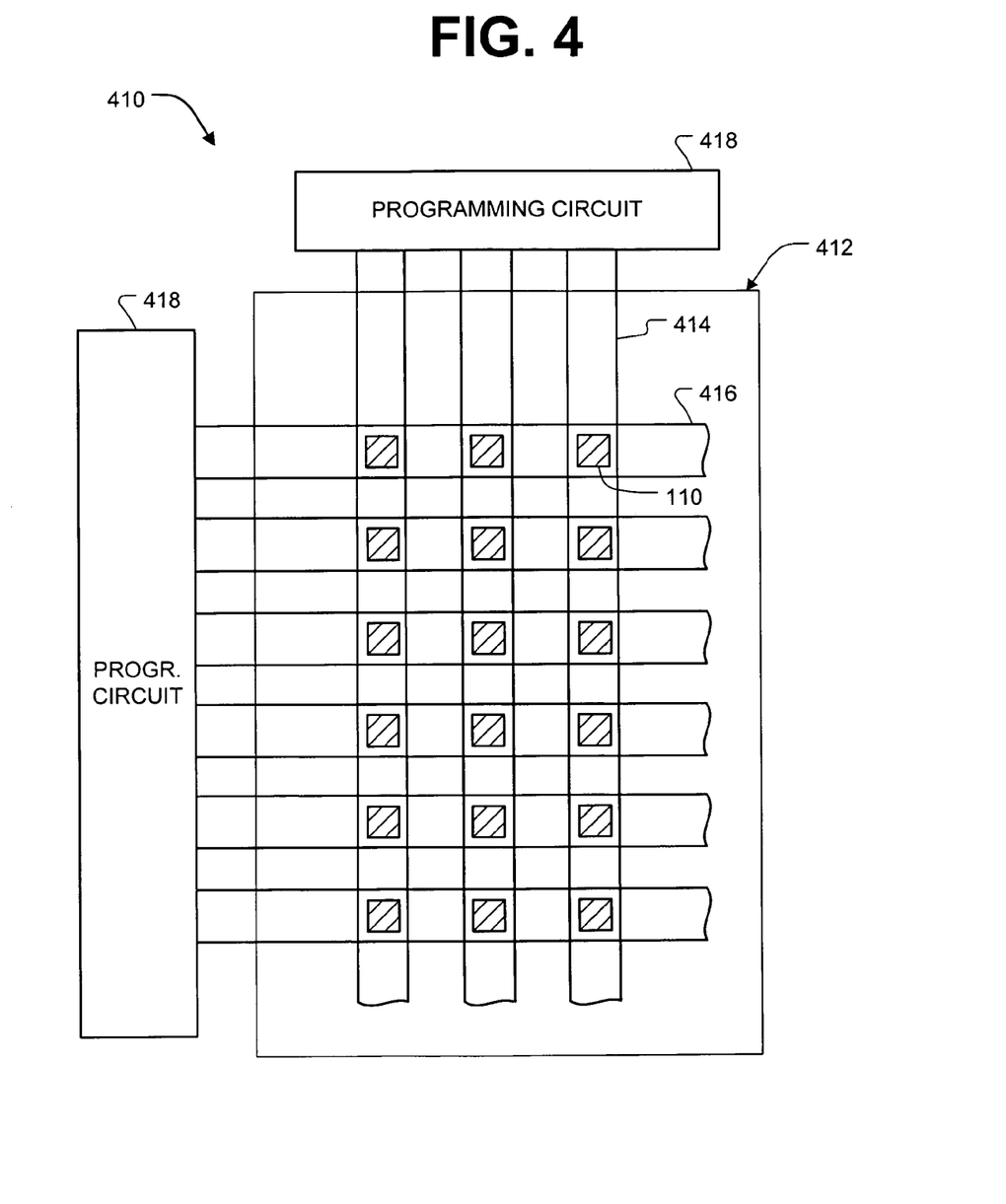
FIG. 4 is an illustration of a data storage device according to an embodiment of the present invention.

Reference is made to FIG. 4, which illustrates an exemplary data storage device 410. The data storage device 410 includes a resistive cross point array 412 of memory devices 110. The memory devices 110 are arranged in rows and columns. Only a relatively small number of memory devices 110 is shown to simplify the illustration of the data storage device 410. In practice, arrays of other sizes may be used.

Word lines 414 extend along rows of the array 412. Bit lines 416 extend along columns of the array 412. There may be one word line 414 for each row of the array 412 and one bit line 416 for each column of the array 412.

Each memory device 110 is located at a cross point of a word line 414 and a bit line 416. The memory devices 110 in the array 412 are coupled together through many parallel paths. The resistance seen at one cross point equals the resistance of the memory devices 110 at that cross point in parallel with resistances of other memory devices in the array 412.

A programming circuit 418 can program selected memory devices 110 in the array 412. The programming circuit 418 can also perform write and erase operations on selected memory devices 110. A selected memory device 110 lies at the cross point of a selected word line 414 and a selected bit line 416. Memory devices 110 crossed by only a single selected line 414 or 416 and memory devices 110 crossed by two unselected lines 414 and 416 are considered "unselected" memory devices.

Since the memory devices 110 are arranged in a resistive cross point array, selected memory devices should be isolated from unselected memory devices during operations on selected memory devices. Otherwise, sneak path currents can interfere with operations on selected memory devices.

Figure 5A:
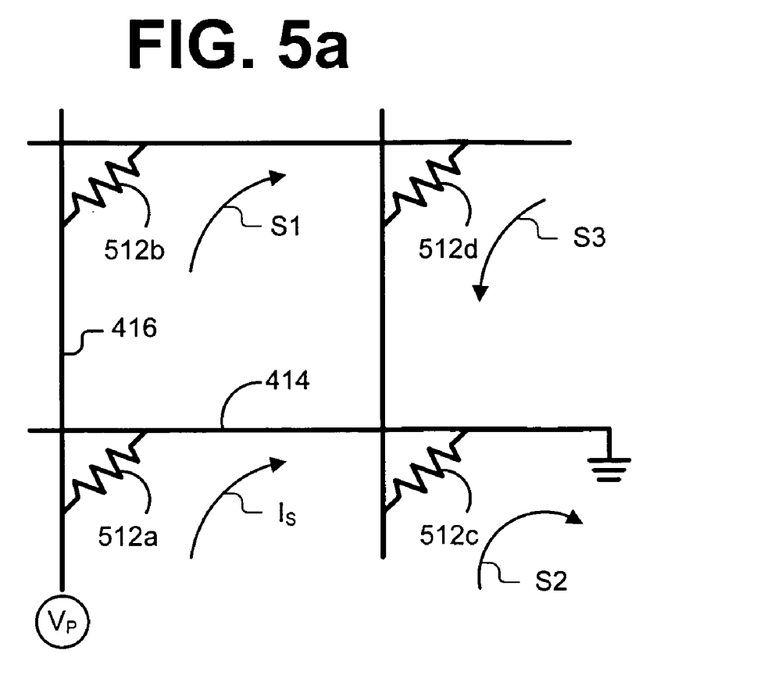
FIGS. 5a and 5b are illustrations of possible sneak path currents in the data storage device during a programming operation.

FIG. 5a illustrates the problem with sneak path currents in resistive cross point arrays. FIG. 5a shows an electrical equivalent of the array 412 during a read operation. A selected memory device is represented by a first resistor 512a. A second resistor 512b represents unselected memory devices along the selected bit line 416, a third resistor 512c represents unselected memory devices along the selected word line 414, and a fourth resistor 512d represents the remaining unselected memory devices. If, for example, all of the memory devices have a resistance of about R+B and if the array 412 has n rows and m columns, then the second resistor 512b will have a resistance of about (R+B)/(n−1), the third resistor 512c will have a resistance of about (R+B)/(m−1), and the fourth resistor 512d will have a resistance of about (R+B)/[(n−1)(m−1)].

The first resistor 512a may be selected by applying a programming potential ($V_P$) to the selected bit line and a ground potential to the selected word line. Consequently, a sense current ($I_S$) flows through the first resistor 512a. However, the second, third and fourth resistors 512b, 512c and 512d also see the programming potential ($V_P$) and the ground potential; therefore, sneak path currents (S1, S2 and S3) can flow through the second, third and fourth resistors 512b, 512c and 512d. Moreover, the resistances of the second, third and fourth resistors 512b, 512c and 512d are much smaller than the resistance of the selected (first) resistor 512a; therefore, the sneak path currents (S1, S2 and S3) are larger than the sense current ($I_S$). Such sneak path currents (S1, S2 and S3) would normally obscure the sense current ($I_S$) during an operation on the selected memory device.

The sneak path currents can be blocked by adding blocking devices (not shown) to the array 412. Each memory device 110 may be connected in series with a blocking device such as a diode or transistor. A similar approach is used in magnetic random access memory (MRAM).

Reference is once again made to FIG. 4. If blocking devices are used, the programming circuit 418 may perform an operation on a selected memory device by applying a programming potential to the selected word and bit lines, and the sensing resistance of the selected memory device.

The programming potential may be ramped up from a small voltage (e.g., 200-500 millivolts) to a higher voltage (e.g., 1-2 volts). The programming potential ramp is preferred for resistive cross point arrays because it can be used to control transient currents which may affect pre-amplifiers of the programming circuit 418. A programming potential ramp is easy to implement and the rate of the ramp is easy to control considering that some arrays may switch significantly sooner the others. The rate at which PMC memory devices switch from one state to another is a function of the properties and thickness of the electrolyte.

A memory device 110 may be erased by reversing the programming potential ramp that was applied during programming. The threshold voltage for erasing the memory device 110 may be much lower than the programming voltage because the erase operation does not require electron tunneling through the dielectric 114 or barrier breakdown.

There are drawbacks to the blocking devices. The silicon area required to implement a blocking device is in series with each memory device. This reduces the potential density advantage of programmable resistive memory technology. Fabricating and connecting the blocking devices can further complicate (and increase the cost of) fabrication. Yet another disadvantage is that the blocking devices can adversely affect the read operations, since voltage drops across the blocking devices can occur at high current densities.

Figure 5B:
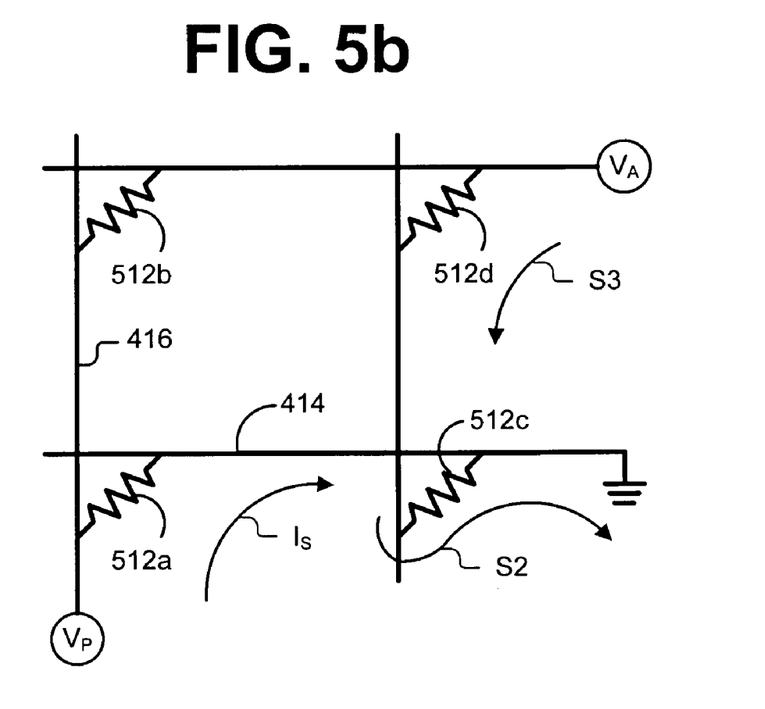

To prevent sneak path currents from obscuring the sense current ($I_S$) without the use of blocking devices, an equipotential isolation method may be used. As shown in FIG. 5b, a programming potential $V_P$ is applied to a bit line 416 crossing the selected memory device 512a, and an array potential $V_A$ is applied to the unselected word lines 414. The word line 414 crossing the selected memory device 512a is connected to ground, whereby a sense current ($I_S$) flows through the selected memory device 512a. The programming potential $V_P$ is about equal to the array potential $V_A$; therefore, an insignificant sneak path flows through the unselected memory devices represented by resistor 512b. Sneak path currents S2 and S3 flow through the other unselected memory devices, but follow separate paths, and do no interfere with the sense current ($I_S$).

Figure 6:
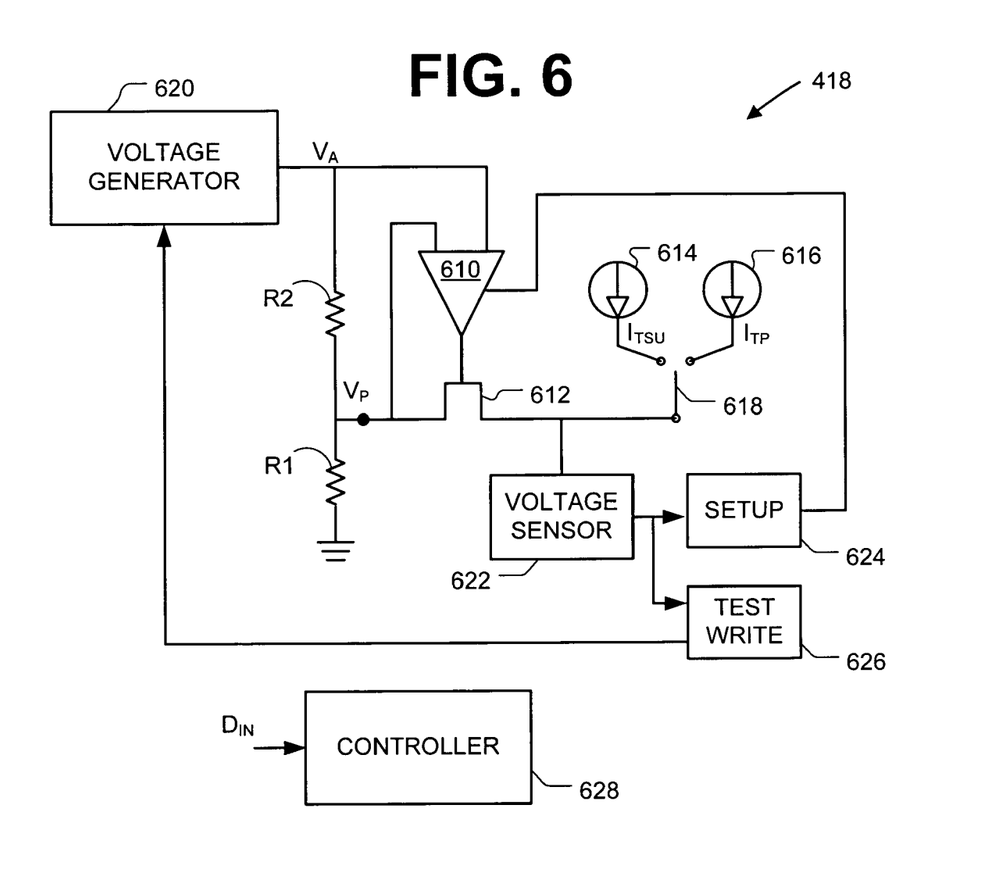
FIG. 6 is an illustration of a programming circuit according to an embodiment of the present invention.

Reference is now made to FIG. 6, which illustrates an exemplary programming circuit 418 for performing programming operations while applying an equipotential to the array 412. The programming circuit 418 includes a pre-amplifier 610 and a FET 612. An output of the pre-amplifier 610 is coupled to a gate of the FET 612, and a first input of the pre-amplifier 610 is coupled to a source of the FET 612. The array potential $V_A$ is applied to a second input of the pre-amplifier 610. The programming potential $V_P$ is at the source of the FET 612.

During a programming operation, a selected memory device is between the programming potential $V_P$ and ground, and unselected memory devices are between the programming and array potentials $V_P$ and $V_A$ (in FIG. 6, the selected memory device is represented by a first resistor R1 and other memory devices are represented collectively by a second resistor R2).

An ideal pre-amplifier would have infinite gain and perfectly matched transistors. If the pre-amplifier 610 is ideal, the potential $V_P$ is exactly equal to $V_A$, yielding the ideal condition for equipotential isolation.

In practice, however, the pre-amplifier 610 is not ideal and has various degrees of offset. Therefore, a pre-amplifier 610 that is not ideal has an offset adjust to provide conditions that are acceptable for equipotential isolation. An exemplary pre-amplifier with offset is disclosed in U.S. Pat. No. 6,262,625 ("Operational Amplifier with Digital Offset Calibration").

The programming circuit 418 includes constant current sources 614 and 616 for providing a test setup current ($I_{TSU}$) and a test programming current ($I_{TP}$), and a switch 618 for selecting the source 614 or 616. The selected current source 614 or 616 provides current to a drain of the FET 612.

The test setup current ($I_{TSU}$), which is used to adjust the offset of the pre-amplifier 610, may be about one microamp. The test programming current ($I_{TP}$) is variable between 10× the test setup current (e.g., 10 microamps) and twice the test setup current (e.g., 2 microamps). The higher magnitude of the test programming current is used to program the selected memory device to a low resistance state, and the lower magnitude of the test programming current is used to program the selected memory device to a high resistance state. The ratio of the test setup current to the test programming current is arbitrary and may be adjusted as a control parameter to set the sensitivity of the pre-amplifier 610 when considering large arrays of memory devices. The ratio will depend upon factors such as the expected range of resistance change, the size of the memory array, the sensitivity of the pre-amplifier 610, and the desired performance.

The programming circuit 418 also includes a voltage generator 620 for supplying the array potential $V_A$ to the second input of the pre-amplifier 610. In a first mode of operation, the voltage generator 620 can create a programming potential ramp from a lower voltage (V1) to a higher voltage (V2). In a second mode of operation, the voltage generator 620 can create a programming potential ramp in the opposite direction, from the higher voltage (V2) to the lower voltage (V1). In a third mode of operation, the voltage generator 620 applies a constant voltage.

A voltage sensor 622 is coupled to the drain of the FET 612. The voltage sensor 622 senses a current relationship. If the current from current source 614 or 616 is greater than the current flowing through the selected memory device R1, the voltage at the input of the voltage sensor 622 is a high potential (close to VDD). If the current from current source 614 or 616 is less than the current flowing through the selected memory device R1, the voltage sensor input voltage is a low potential (close to $V_P$). Hence, the voltage sensor 622 senses the state of the selected memory device R1 relative to the applied current source 614 or 616. The pre-amplifier 610 conditions the programming potential $V_P$ to isolate the voltage sensor 622 from the memory array 412.

A setup circuit 624 determines the offset adjust for the pre-amplifier 610. A test write circuit 626 couples the voltage sensor 622 to the voltage generator 620. When the magnitude of the sense current through the selected memory device reaches the magnitude of the appropriate test write current (the magnitude depends upon whether a high or low resistance is being programmed), the output of the test write circuit 626 causes the voltage generator 620 to turn off the array voltage $V_A$.

A controller 628 has an input $D_{IN}$ that receives a data-in signal (e.g., externally from a pin of a chip). The data-in signal specifies whether a selected memory cell will be programmed with a data '1' or '0'. Receipt of the data-in signal externally initiates the programming. After receiving the data-in signal, the controller 628 generates timing and control signals for the programming circuit 418, as well as values of the current sources 614 and 616 and directions for the voltage generator 620. The ratio of the test setup current to the test programming current may be externally set or may be adaptively set by the controller 628.

Figure 7:
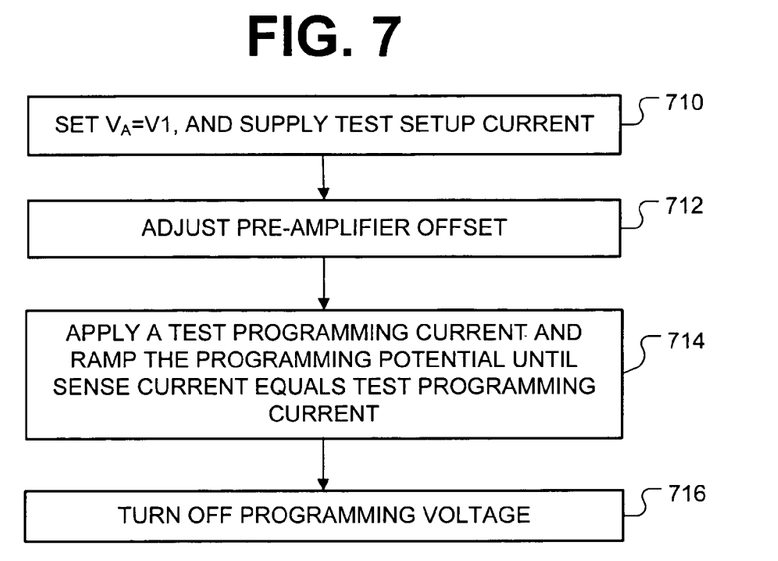
FIG. 7 is an illustration of a programming operation on a programmable resistive memory device in a resistive cross point array according to an embodiment of the present invention.

Additional reference is made to FIG. 7, which illustrates an example of using the programming circuit 418 to program the selected memory device. In this example, the selected memory device will go from a high resistance to a low resistance.

The voltage generator 620 applies a first DC voltage of $V_A=V1$ to the second input of the pre-amplifier 610, and the test setup current source 614 provides a test setup current to the drain of the FET 612 (block 710). The setup block 624 determines the sense current through the FET 612 and compares the sense current to the test setup current so that the off-set parameters of the pre-amplifier 610 may be adjusted so the programming potential $V_P$ is approximately equal to the array potential $V_A$ (block 712). The conditions for equipotential isolation are established with the setup test current as an initial condition for the programming operation.

After the pre-amplifier offset has been adjusted, the selected memory device is programmed. The test programming current ($I_{TP}$) and a programming potential ramp are applied to the selected memory device until the sense current reaches the test programming current (block 714). The test programming current provides a threshold. When the write test circuit 624 determines that the threshold has been reached, it is assumed that the selected memory device has switched from a high resistance state to a low resistance state. Therefore, the programming voltage is removed to minimize stress on the memory device (block 716).

As the programming potential ramp is being applied, the pre-amplifier 610 maintains an equipotential on the array. Consequently, sneak path currents do not interfere with the sense current flowing through the selected memory device.

Except as follows, the same procedure may be used to change the state of the selected memory device from a low resistance state to a high resistance state. A negative going programming potential ramp is applied while the test programming current ($I_{TP}$) with the lower magnitude is used for a threshold.

The voltage generator 620 is not limited to ramping the array voltage $V_A$ between the lower and higher voltages V1 and V2. Although a programming potential ramp is preferred, other voltage waveforms may be applied. However, the programming potential ramp starts at a safe low voltage and changes to a higher voltage in a controlled manner, assuming the memory device will change resistance state sometime within the programming potential ramp. Advantages of a programming potential ramp include minimizing the exposure of the memory device to excessive voltages, minimizing stresses, and improving the reliability of the write operations.

An advantage of the equipotential isolation for both the read and programming operations is integration of dense, multi-plane memory arrays (low cost memory follows from dense, multi-plane memory structures).

Advantages of minimizing the programming time include a reduction in stresses and an increase in endurance of programmable resistive memory devices. Minimizing the programming time allows the resistance of the conductive filament to be kept relatively high. This can reduce the affect of unselected programmed memory devices on the performance of the equipotential isolation circuits.

The data storage device of FIG. 4 may also include a read circuit for performing read operations on selected memory devices. If blocking devices are used, the read circuit 418 may perform a read operation on a selected memory device by applying a voltage to a selected bit line, connecting a selected word line to ground, and sensing the current flowing through the selected memory device. A relatively high sense current indicates a low resistance (and a first logic value), and a relatively low sense current indicates a high resistance (and a second logic value). The logic value may be determined by comparing the sense current to a reference value. The reference value may be midway between the sense current corresponding to the high resistance and the sense current corresponding to the low resistance. The blocking devices prevent sneak path currents from interfering with the read operation.

If equipotential isolation is used, the read circuit includes a pre-amplifier. An exemplary read circuit is illustrated in FIG. 8.

Figure 8:
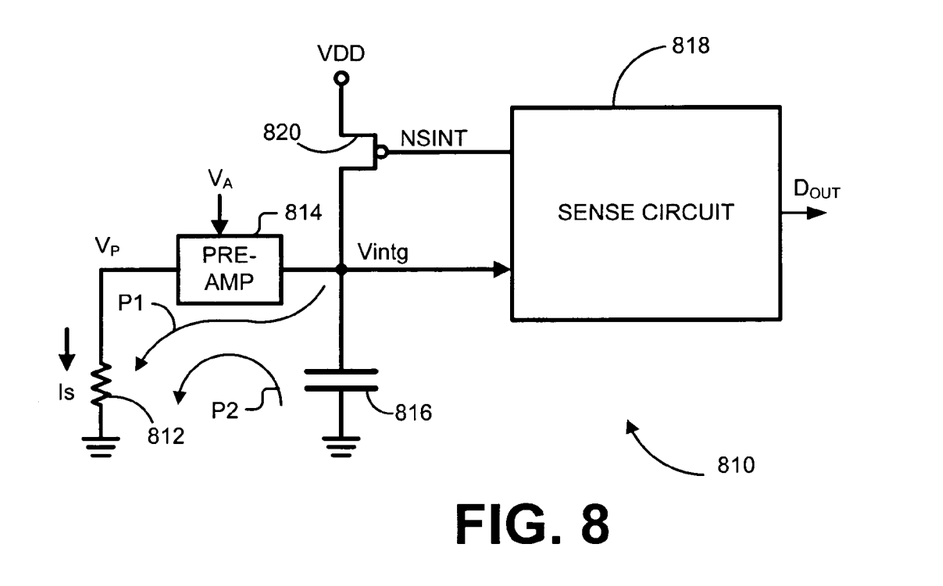
FIG. 8 is an illustration of a read circuit according to an embodiment of the present invention.

Reference is now made to FIG. 8, which illustrates a read circuit 810 including a pre-amplifier 814 for achieving equipotential isolation during the read operations on selected memory devices (a selected memory device is represented by a resistor 812). Equipotential sensing includes setting up the pre-amplifier 814 by applying a set up test current and adjusting the offset voltage of pre-amplifier 814 until the conditions for equipotential sensing are met. After the pre-amplifier 814 is set up, the pre-amplifier 814 functions as a constant current source to discharge an integration capacitor 816. The rate of discharge is sensed and compared in a digital self-referenced sense circuit 818. The integration capacitor 816 is reset by reset switch 820, which may be a PMOS transistor. An external control signal NSINT controls whether the reset switch 820 is on (conducting) or off (not conducting). When the reset switch 820 is on, a supply voltage VDD is applied to the integration capacitor 816 and the selected memory device (represented by a resistor 812) through the pre-amplifier 814. Thus, the integration capacitor 816 is charged as a first signal follows a first path P1, which goes through the reset switch 820 and the selected memory device 812. When the reset switch 820 is off, the sense current ($I_S$) flowing through the selected memory device 812 is supplied from the integration capacitor 816. A second (sense) signal follows a second path P2, which goes through the integration capacitor 816 and the selected memory device 812. The second signal includes current from the selected memory device 812 and parasitic currents in the array 412. The parasitic currents in the array 412 can arise due to the potential $V_P$ across the unselected memory devices not being precisely equal to the applied array potential $V_A$.

As long as the voltage Vintg across the integration capacitor 816 is greater than the voltage across the selected memory device 812, the integration capacitor 816 functions as a linear integrator.

The pre-amplifier 814 controls a sense voltage $V_A$ across the memory devices independent of the sense current. When a constant equipotential error voltage $V_A$-$V_P$ (at this point, $V_A$ is considered constant) is applied to all memory devices (that is an equipotential across the memory devices), variations in the selected memory device will not cause a current variation across the remaining parallel memory devices and, thus, the parasitic sense current can be made substantially less than the sense current. The current that flows in the pre-amplifier 814 is then directly proportional to the resistance of the selected memory device 812 without having to make corrections or adjustments for variations in the sense potential $V_A$.

The resistance of the selected memory device 812 and the capacitance of the integration capacitor 816 determine how fast the integration capacitor 816 is discharged after the reset switch 820 is opened. All other parameters being equal, the integration capacitor 816 will discharge faster when the selected memory device 812 has a low resistance state than when the selected memory device 812 has a high resistance state.

The sense circuit 818 measures an integration time that is directly proportional to the resistance state of the selected memory device 812 and, therefore, the logic value stored in the selected PMC device 812. A data '0' or '1' is provided on an output $D_{OUT}$ of the sense circuit 818. An exemplary sense circuit 818 and its operation are described in greater detail in U.S. Pat. No. 6,188,615. Although the sense circuit in the '615 patent is described in connection with Magnetic Random Access Memory, the sense circuit can also be applied to programmable resistive memory.

The read circuit of FIG. 8 can be integrated with the programming circuit of FIG. 6. The read circuit may share the pre-amplifier with the programming circuit 418. The intrinsic capacitance at the drain of the FET 620 may provide the capacitance for integration. A separate FET 820 and a sense circuit 818 would be added to the programming circuit. The controller 628 would also generate timing and control signals for the FET 820 and the sense circuit 818.

The memory devices are not limited to PMC memory devices. The methods and circuits above may be applied to other types of programmable resistive memory devices. For example, the memory devices may include phase change random access memory ("TRAM" or "PRAM"). In TRAM/PRAM, the data is stored in a memory device as either a region of crystalline material (low resistance state) or amorphous material (high resistance state). The change of phase from amorphous to crystalline or crystalline back to amorphous is a function of the time dependent thermal energy supplied to the region of the memory device.

The method according to the present invention is not limited to data storage. For example, the method may be applied to programmable resistive devices that are part of a display (where each display element is coupled to a programmable resistive devices), or the method may be applied to programmable resistive devices that are part of a sensor array, where sensor elements either contribute to the programming of the programmable resistive devices (as some form of photon sensor), or the programmable resistive devices controls the sensitivity of the sensor device.

Although several specific embodiments of the present invention have been described and illustrated, the present invention is not limited to the specific forms or arrangements of parts so described and illustrated. Instead, the present invention is construed according to the following claims.

The invention claimed is:

1. Apparatus for programming selected memory devices in a resistive cross point array of programmable resistive memory devices, the apparatus comprising:
a pre-amplifier for applying a programming potential to a selected one of the memory devices while applying an array potential to other ones of the memory devices, the array and programming potentials being about equal, whereby equipotential isolation of the selected memory device is achieved; and
a circuit for turning off the programming potential when a sense current flowing through the selected memory device indicates that the selected memory device has been programmed.

2. The apparatus of claim 1, wherein the pre-amplifier has an offset adjust; and wherein prior to programming the circuit adjusts the offset of the pre-amplifier until the array and programming potentials are about equal.

3. The apparatus of claim 2, wherein adjusting the offset includes supplying a test setup current to the selected memory device, applying the programming potential to the selected memory device, whereby a sense current flows through the selected memory device; and adjusting the offset until the setup current equals the sense current.

4. The apparatus of claim 3, wherein the circuit provides a test programming current and senses a relationship between the test programming current and the sense current during the programming, the relationship indicating when the selected memory device has been programmed.

5. The apparatus of claim 1, wherein the pre-amplifier has an offset adjust; and wherein the circuit further provides a test setup current and a test programming current to determine when the offset of the pre-amplifier has been adjusted, the ratio of the test setup current to the test programming current being adjusted as a control parameter to set the sensitivity of the pre-amplifier.

6. The apparatus of claim 4, wherein the test programming current is supplied to selected memory device while a programming voltage is being applied to the selected memory device; and wherein the programming voltage is removed when a current flowing through the selected memory device is equal to the test programming current.

7. The apparatus of claim 1, further comprising a FET and a constant current source, an output of the pre-amplifier coupled to a gate of the FET, the constant current source coupled to a first side of a drain-source path of the FET, an input of the pre-amplifier coupled to a second side of the drain-source path.

8. The apparatus of claim 1, further comprising a programming potential ramp generator for providing the programming potential.

* * * * *